(12) United States Patent
Schweiger et al.

(10) Patent No.: US 6,995,582 B2
(45) Date of Patent: Feb. 7, 2006

(54) TESTING DEVICE WITH A CONTACT FOR CONNECTING TO A CONTACT OF A SEMICONDUCTOR COMPONENT

(75) Inventors: Dieter Schweiger, Lappersdorf (DE); Mathias Würzinger, Ringelai (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/195,214

(22) Filed: Jul. 15, 2002

(65) Prior Publication Data

US 2003/0006797 A1 Jan. 9, 2003

Related U.S. Application Data

(63) Continuation of application No. PCT/DE00/04564, filed on Dec. 20, 2000.

(30) Foreign Application Priority Data

Sep. 13, 2003 (DE) .......................... 100 01 117

(51) Int. Cl.
  *G01R 31/06* (2006.01)

(52) U.S. Cl. ...................... 324/765; 324/755
(58) Field of Classification Search ................ 324/755, 324/754, 760, 765; 439/482, 826
See application file for complete search history.

(56) References Cited

U.S. PATENT DOCUMENTS

| | | | | |
|---|---|---|---|---|
| 3,354,394 A | * | 11/1967 | William ........................ 324/765 |
| 4,105,970 A | * | 8/1978 | Katz ........................... 324/761 |
| 4,199,209 A | * | 4/1980 | Cherian et al. ............. 439/591 |
| 4,329,642 A | * | 5/1982 | Luthi et al. ................. 324/755 |
| 4,839,587 A | * | 6/1989 | Flatley ........................ 324/761 |
| 4,980,638 A | | 12/1990 | Dermon et al. |
| 5,006,796 A | * | 4/1991 | Burton et al. ............... 324/760 |
| 5,172,049 A | * | 12/1992 | Kiyokawa et al. .......... 324/760 |
| 5,180,974 A | | 1/1993 | Mitchell et al. |
| 5,528,466 A | | 6/1996 | Lim et al. |
| 5,557,212 A | * | 9/1996 | Isaac et al. ................. 324/755 |
| 6,291,265 B1 | * | 9/2001 | Mess ........................... 438/107 |
| 6,340,838 B1 | * | 1/2002 | Chung et al. ............... 257/668 |

FOREIGN PATENT DOCUMENTS

| | | |
|---|---|---|
| DE | 36 33 996 A1 | 4/1988 |
| DE | 41 36 752 A1 | 5/1993 |
| DE | 43 01 420 A1 | 6/1993 |
| EP | 0 646 800 A1 | 4/1995 |
| JP | 05 029 051 A | 2/1993 |
| JP | 7 072 212 | 3/1995 |
| JP | 11 271 392 | 10/1999 |
| WO | WO 96/14660 | 5/1996 |

OTHER PUBLICATIONS

Hock, T. K. et al.: "Radio Frequency Test Connector", Motorola Technical Developments, vol. 10, Mar. 1990, pp. 108–112.

Thompson, B. J.: "Get a Grip pm RF Components", Test & Measurement World, May 1994, pp. 73–76.

* cited by examiner

*Primary Examiner*—Vinh P. Nguyen
(74) *Attorney, Agent, or Firm*—Laurence A. Greenberg; Werner H. Stemer; Ralph E. Locher

(57) ABSTRACT

A testing device for a semiconductor component including at least one first contact. The testing device contains at least one second contact for producing an electrical connection to the first contact. The second contact is immobile relative to the testing device.

8 Claims, 1 Drawing Sheet ns" (*Test and Measurement World;* May 1994:73ff). FIG.
TESTING DEVICE WITH A CONTACT FOR CONNECTING TO A CONTACT OF A SEMICONDUCTOR COMPONENT

CROSS-REFERENCE TO RELATED APPLICATION

This application is a continuation of copending International Application No. PCT/DE00/04564, filed Dec. 20, 2000, which designated the United States and was not published in English.

BACKGROUND OF THE INVENTION

Field of the Invention

The invention relates to a testing device for a semiconductor component including at least one first contact, with at least one second contact for producing an electrical connection to the first contact.

Testing devices serve for testing semiconductor components for serviceability following their fabrication. The semiconductor component—the specimen—which includes first contacts —is placed on the testing device with the first contacts in contact with second contacts of the testing device to produce an electrical connection. Some of the second contacts are charged with predetermined potentials. The signals that are sent by the semiconductor component are then tapped at other second contacts and fed to an evaluation.

The construction of the second contacts of the testing device is described in the article "Get grip on RP components" (*Test and Measurement World;* May 1994:73ff). FIG. 1 of this article is a cutout of a common testing device. The second contacts, i.e., the contacts of the testing device, are connected to the testing device to be rotatable about a horizontal elastomer axis. The semiconductor component is placed on the testing device such that the first contacts (of the semiconductor component) become connected to the second contacts (of the testing device). To produce a low-impedance connection between the first and second contacts, a stamp (a contact pressure block) exerts pressure on the first contact. As a consequence of the stamp pressure, the second contacts of the testing device, which are movable, are shifted slightly out of neutral position.

Due to the slight relative movement of the second contact in relation to the first contact, the second contacts become worn over time. Such wearing roughens the surfaces of the second contacts. Thus, the contact resistance between the first and second contacts changes over time. Given the variance over time, the contact resistance can falsify the test results.

An additional disadvantage of spring-mounted second contacts is that the capacity between the first contact and the track (signal trace) changes as the spacing varies. Such variation of the parasitic capacities can also lead to falsification of the measuring results.

SUMMARY OF THE INVENTION

It is accordingly an object of the invention to provide a testing device for a semiconductor component that overcomes the hereinafore-mentioned disadvantages of the heretofore-known devices of this general type and that avoids the above described disadvantages.

With the foregoing and other objects in view, there is provided, in accordance with the invention, a semiconductor component testing device, including at least one immobile second contact to be electrically connected to at least one first contact of a semiconductor component, the at least one second contact being immobile relative to the testing device.

Accordingly, it is inventively provided that the second contact be immobile in relation to the testing device. As a result, only small parasitic capacities arise because the spacing between a first contact of the semiconductor component and a metal in the testing device cannot vary. Furthermore, because there is no relative movement between the first contact and the second contact, hardly any abrasion events occur at the second contacts of the testing device.

In accordance with another feature of the invention, the second contacts have the shape of a lamina and/or are lamina-shaped. This means that the second contacts have a flat surface. The dimensions of the lamina are preferably selected so as to be larger than the first contacts of the semiconductor component. Such a configuration makes possible a more secure contact. On the other hand, by virtue of its flat main surface, the lamina can be effectively connected to a track of the testing device. The connection between the lamina and the track can be realized by soldering.

The second contacts advantageously are of a hard, highly conductive material. The harder the material, the less wear that occurs over time. In a preferred variant, the second contacts are of beryllium copper. The second contacts could also conceivably be made of platinum. Beryllium copper has the characteristic that it exhibits only a small mechanical expansion given temperature fluctuations. Because the expansion is small, very small parasitic electrical components emerge, which exert practically no influence on the characteristics of the semiconductor component during the test procedure. The small parasitic electrical components can represent the above mentioned parallel capacity or a series inductivity.

To achieve an optimally small contact resistance and an insensitivity to deposits or contaminants, it is advantageous to construct the surface of the second contacts so that they include peaks. The peaks can have the shape of a triangle or polygon or any other shape. If possible, the spacing of the peak of the surface of the second contact should be no greater than the width of the peak on the surface of the second contacts. Such a configuration guarantees that the peak cannot break even under large mechanical loads. The peak is disposed on the surface of the second contact that faces the first contact of the semiconductor component. For testing, the first contacts of the semiconductor component are separately pressed onto the peaks of the second contacts by a stamp. It goes without saying that the stamp for exerting the pressure is of an insulating material.

With the objects of the invention in view, there is also provided a semiconductor component testing device, including a testing base and at least one second contact to be electrically connected to at least one first contact of a semiconductor component, the at least one second contact connected to and being immobile relative to the testing base.

With the objects of the invention in view, there is also provided a semiconductor component testing device, including a carrier with a surface, an insulating substrate disposed on the surface, and at least one contact to be electrically connected to at least one component contact of the semiconductor component, the at least one contact connected to the insulating substrate, the at least one contact being immobile relative to the insulating substrate and to the carrier.

In case high temperatures arise in the semiconductor component during testing, it can be advantageous to provide a heat sink in the testing device, which is then connected to the semiconductor component.

With the objects of the invention in view, there is also provided a semiconductor component testing device, including a carrier with a surface, an insulating substrate disposed on the surface, a heat sink disposed on the surface for conveying heat from a semiconductor component to the carrier, and at least one contact to be electrically connected to at least one component contact of the semiconductor component, the at least one contact connected to the insulating substrate, the at least one contact being immobile relative to the insulating substrate and to the carrier.

Other features that are considered as characteristic for the invention are set forth in the appended claims.

Although the invention is illustrated and described herein as embodied in a testing device for a semiconductor component, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
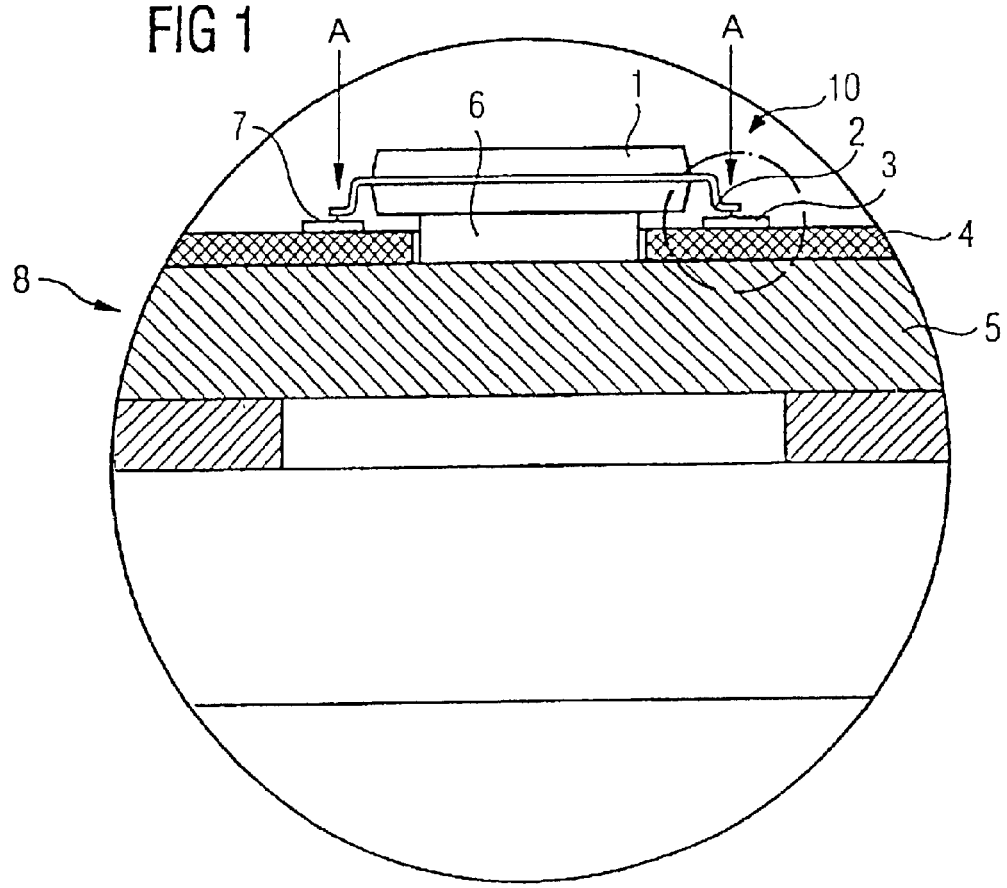
FIG. 1 is a fragmentary cross-section of an embodiment of the testing device according to the invention.

Referring now to the Figures of the drawings in detail and first, particularly to FIG. 1 thereof, there is shown an exemplifying embodiment of the inventive testing device 8. The testing device 8 includes an insulating substrate 4, on which tracks 10 have been installed. The substrate 4 lies on a carrier 5, which is connected to a semiconductor component 1 by way of a heat sink 6 and which produces a ground-related, highly thermally conductive contact to the semiconductor component 1. Each track 10 is connected to a second contact 3. The second contact 3 is constructed in the shape of a lamina, preferably, of beryllium copper. The second contact 3 is permanently connected to the track 10, for instance, by soldering.

The second contact 3 includes a peak 7 (see FIG. 2) that is connected to a first contact 2 of a semiconductor component. The first contacts 2 are pressed to the second contacts 3 by a pressure. The arrows A are meant to indicate such pressure. The pressuring tool is not represented in FIG. 1. The pressuring tool provides that the peaks 7 of the second contacts 3 press lightly into the first contacts 2. As such, low contact resistance can be produced.

Figure 2:
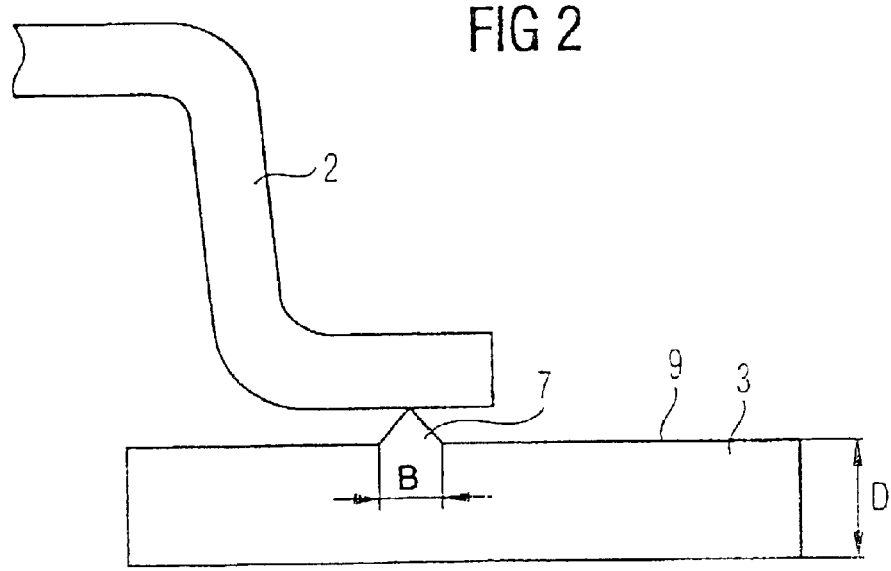
FIG. 2 is an enlarged, fragmentary cross-section of first and second contacts of FIG. 1.

FIG. 2 represents an enlarged view of the mechanical connection between the first contact 2 and the second contact 3 with its peak 7. The second contact 2 is in contact with the peak 7. With the aid of the non-illustrated pressuring tool, the peak 7 presses lightly into the first contact 2.

In the present exemplifying embodiment, the peak 7 is constructed in the shape of a triangle. The peak 7 could also be constructed in the shape of a polygon or any other shape. It is advantageous when the spacing between the peak 7 and the surface 9 of a second contact 3 is smaller than the spacing B. The peak 7 can be produced by milling the lamina, which has a cuboid cross-section, from the surface 9. The second contact 3 preferably has a thickness D between 200 and 300 $\mu$m. Such a configuration guarantees a high durability of the second contact.

FIG. 1 represents a semiconductor component 1 in which the first contacts 2 are situated adjacent its housing. It would also be imaginable to apply the inventive testing device to semiconductor components wherein the first contacts are situated beneath the housing. It goes without saying that the second contacts 3 must be respectively adapted to the layout of the first contacts 2 of the semiconductor component. For semiconductor components in which the first contacts are situated below the housing, a tool would have to exert the pressure directly onto the housing to produce a low-resistance connection between the first and second contacts.

Compared to prior art testing devices that utilize spring contacts, substantially smaller parasitic electrical components emerge in the testing configuration according to the invention due to the immobility of the second contacts relative to the testing device. The mechanical loads on the second contacts, thus, being slight, the long-term durability of the second contacts of the testing device is guaranteed.

We claim:

1. A semiconductor component testing device, comprising:

a testing base being installed with tracks; and at least one second contact to be electrically connected to at least one first contact of a semiconductor component, said at least one second contact connected to said tracks and being immobile relative to said testing base, said at least one second contact being of a lamina shape.

2. The testing device according to claim 1, wherein said at least one second contact is of a hard, highly conductive material.

3. The testing device according to claim 1, wherein said at least one second contact is of beryllium copper.

4. The testing device according to claim 1, wherein said at least one second contact has at least one peak.

5. A semiconductor component testing device, comprising:

a carrier with a surface;

an insulating substrate disposed on said surface, said insulating substrate being installed with tracks; and at least one contact to be electrically connected to at least one component contact of the semiconductor component, said at least one contact connected to said tracks of said insulating substrate, said at least one contact being immobile relative to said insulating substrate and to said carrier, said at least one contact being of a lamina shape.

6. The testing device according to claim 5, wherein said at least one contact has at least one peak to be electrically connected to the component contact.

7. A semiconductor component testing device, comprising:

a carrier with a surface;

an insulating substrate disposed on said surface, said insulating substrate being installed with tracks;

a heat sink disposed on said surface for conveying heat from a semiconductor component to said carrier; and at least one contact to be electrically connected to at least one component contact of the semiconductor component, said at least one contact connected to said tracks of said insulating substrate, said at least one contact being immobile relative to said insulating substrate and to said carrier, said at least one contact being of a lamina shape.

8. The testing device according to claim 7, wherein said at least one contact has at least one peak to be electrically connected to the component contact.

* * * * *